(12) United States Patent
Zhang et al.

(10) Patent No.: US 11,698,146 B2
(45) Date of Patent: Jul. 11, 2023

(54) ELECTRONIC EXPANSION VALVE, THERMAL MANAGEMENT ASSEMBLY, COOLING SYSTEM, AND METHOD FOR MANUFACTURING ELECTRONIC EXPANSION VALVE

(71) Applicant: ZHEJIANG SANHUA AUTOMOTIVE COMPONENTS CO., LTD., Hangzhou (CN)

(72) Inventors: Rongrong Zhang, Hangzhou (CN); Lei Zhou, Hangzhou (CN); Yingchong Lu, Hangzhou (CN); Xiangli Sun, Hangzhou (CN)

(73) Assignee: ZHEJIANG SANHUA AUTOMOTIVE COMPONENTS CO., LTD., Hangzhou (CN)

( * ) Notice: Subject to any disclaimer, the term of this patent is extended or adjusted under 35 U.S.C. 154(b) by 742 days.

(21) Appl. No.: 16/610,756

(22) PCT Filed: Mar. 16, 2018

(86) PCT No.: PCT/CN2018/079261
§ 371 (c)(1),
(2) Date: Nov. 4, 2019

(87) PCT Pub. No.: WO2018/205746
PCT Pub. Date: Nov. 15, 2018

(65) Prior Publication Data
US 2020/0163263 A1 May 21, 2020

(30) Foreign Application Priority Data

May 9, 2017 (CN) .......................... 201710319514.7
May 9, 2017 (CN) .......................... 201720506326.0

(51) Int. Cl.
*F16K 27/02* (2006.01)
*F16K 31/04* (2006.01)
(Continued)

(52) U.S. Cl.
CPC .......... *F16K 37/005* (2013.01); *F16K 27/029* (2013.01); *F16K 31/04* (2013.01);
(Continued)

(58) Field of Classification Search
CPC .. F25B 41/35; F25B 2341/068; F16K 31/046; F16K 37/005
See application file for complete search history.

(56) References Cited

U.S. PATENT DOCUMENTS 4,167,858 A * 9/1979 Kojima .................. G01K 13/02
374/E13.006
4,561,261 A * 12/1985 Kornrumpf ............... G01L 9/16
307/118
(Continued)

FOREIGN PATENT DOCUMENTS

CN       1425864 A      6/2003
CN       101551174      10/2009
(Continued)

OTHER PUBLICATIONS

Zhao, "Norma Product Digital Planning", Cases of CN Machinery Equipment, Chinese Mechanical Engineering Society, Jun. 30, 2016.
(Continued)

*Primary Examiner* — Matthew W Jellett
(74) *Attorney, Agent, or Firm* — Boyle Fredrickson S.C.

(57) ABSTRACT

An electronic expansion valve and a manufacturing method therefor, a thermal management assembly and a cooling system are provided. The electronic expansion valve includes a valve core assembly, an electronic control part
(Continued)

and a stator assembly. The valve core assembly includes a valve base, a valve core and a rotor assembly, wherein the valve base is provided with a valve port, and the valve core moves relative to the valve base to change the degree of opening of the valve port. The electronic control part controls the stator assembly, and the rotor assembly drives the valve core to move. The electronic expansion valve further includes a sensor, the electronic control part includes an electronic control board, and the stator assembly and the sensor are both directly electrically connected to the electronic control board. The thermal management assembly and the cooling system both include the electronic expansion valve.

11 Claims, 11 Drawing Sheets

(51) Int. Cl.
    *F16K 37/00*     (2006.01)
    *F24F 11/63*     (2018.01)
    *H05K 13/04*     (2006.01)
    *F25B 41/35*     (2021.01)
    *F16K 31/50*     (2006.01)
    *F25B 41/34*     (2021.01)

(52) U.S. Cl.
    CPC .......... *F16K 31/508* (2013.01); *F24F 11/63* (2018.01); *F25B 41/35* (2021.01); *H05K 13/04* (2013.01); *F25B 41/34* (2021.01); *F25B 2341/068* (2013.01)

(56) References Cited

U.S. PATENT DOCUMENTS

| | | | | |
|---|---|---|---|---|
| 4,571,951 A * | 2/1986 | Szymaszek | ............ | F25B 41/34 62/212 |
| 4,835,976 A * | 6/1989 | Torrence | ............... | F25B 41/347 62/204 |
| 4,848,100 A * | 7/1989 | Barthel | ................. | F25B 41/347 62/181 |
| 4,890,459 A * | 1/1990 | Havemann | ........... | F25B 49/005 62/158 |
| 4,930,353 A * | 6/1990 | Kato | ..................... | G01L 19/148 374/143 |
| 5,605,318 A * | 2/1997 | Malone | ................. | F25B 41/345 251/129.15 |
| 5,806,565 A * | 9/1998 | Kadlicko | ............ | F15B 13/0438 137/625.63 |
| 6,375,086 B1 * | 4/2002 | Babin | ..................... | F25B 41/35 236/92 B |
| 6,913,037 B2 * | 7/2005 | Miyazoe | ............. | F15B 13/0817 137/557 |
| 8,281,607 B2 * | 10/2012 | Dolin | ...................... | F25B 41/34 62/212 |
| 10,197,314 B2 | 2/2019 | Birkelund | | |
| 2004/0003850 A1 * | 1/2004 | Miyazoe | ............... | F16K 31/426 137/557 |
| 2004/0249514 A1 | 12/2004 | Rentmeester et al. | | |
| 2008/0190493 A1 * | 8/2008 | Oh | ....................... | G01L 19/0609 137/554 |
| 2009/0249802 A1 | 10/2009 | Nemesh et al. | | |
| 2010/0031681 A1 | 2/2010 | Dolin | | |
| 2012/0240898 A1 | 9/2012 | Lemecha et al. | | |
| 2013/0088361 A1 | 4/2013 | Pike | | |
| 2015/0292647 A1 | 10/2015 | Le Pellec et al. | | |
| 2016/0109317 A1 * | 4/2016 | Gilman | ............... | G01L 19/0092 29/890.035 |
| 2016/0313037 A1 | 10/2016 | Takahashi | | |
| 2018/0023835 A1 * | 1/2018 | Ooura | ..................... | F25B 41/35 165/288 |

FOREIGN PATENT DOCUMENTS

| | | |
|---|---|---|
| CN | 201945102 U | 8/2011 |
| CN | 102691579 A | 9/2012 |
| CN | 203404907 U | 1/2014 |
| CN | 104344050 A | 2/2015 |
| CN | 104806774 | 7/2015 |
| CN | 1048063774 | 7/2015 |
| CN | 104976398 A | 10/2015 |
| CN | 106090384 A | 11/2016 |
| CN | 106151554 | 11/2016 |
| CN | 106415160 A | 2/2017 |
| CN | 106595111 A | 4/2017 |
| CN | 206093141 U | 4/2017 |
| CN | 207049366 U | 2/2018 |
| EP | 0276491 | 8/1988 |
| JP | H10221194 | 8/1998 |
| JP | 2005315550 A | 11/2005 |
| JP | 2007133829 A | 5/2007 |
| JP | 2009127837 A | 6/2009 |
| JP | 2009257985 A | 11/2009 |
| JP | 2016169893 | 9/2016 |
| KR | 20010105743 A | 11/2001 |

OTHER PUBLICATIONS

Xia, "Intelligent Integrated Transmission Technology", Technology Roadmaps of Chinese Mechanical Engineering (Second Edition), Nov. 30, 2016, pp. 476-477.

* cited by examiner

ELECTRONIC EXPANSION VALVE, THERMAL MANAGEMENT ASSEMBLY, COOLING SYSTEM, AND METHOD FOR MANUFACTURING ELECTRONIC EXPANSION VALVE

CROSS-REFERENCE TO RELATED APPLICATIONS

The application is the national phase of International Application No. PCT/CN2018/079261, titled "ELECTRONIC EXPANSION VALVE, THERMAL MANAGEMENT ASSEMBLY, COOLING SYSTEM, AND METHOD FOR MANUFACTURING ELECTRONIC EXPANSION VALVE", filed on Mar. 16, 2018, which claims the benefit of priorities to the benefit of priorities to the following two Chinese Patent Applications, the entire disclosures of which are incorporated herein by reference:

(1) Chinese Patent Application No. 201710319514.7, titled "ELECTRONIC EXPANSION VALVE, THERMAL MANAGEMENT ASSEMBLY, COOLING SYSTEM, AND METHOD FOR MANUFACTURING ELECTRONIC EXPANSION VALVE", filed on May 9, 2017 with the China National Intellectual Property Administration, and (2) Chinese Patent Application No. 201720506326.0, titled "ELECTRONIC EXPANSION VALVE AND THERMAL MANAGEMENT ASSEMBLY INCLUDING ELECTRONIC EXPANSION VALVE", filed on May 9, 2017 with the China National Intellectual Property Administration.

TECHNICAL FIELD

The present application relates to a cooling system and parts thereof.

BACKGROUND OF THE INVENTION

A cooling system includes a compressor, an evaporator, a condenser and throttling elements. In order to improve the flow control accuracy of the working medium, an electronic expansion valve is used as the throttling element in the conventional technology. Usually, the control of electronic expansion valve is realized by collecting parameters from a pressure sensor and a temperature sensor arranged on a pipeline and by calculating a degree of superheat by a controller according to a corresponding control program. In this way, the sensors and the electronic expansion valve are respectively connected with the cooling system through the pipeline to cool the system, but the assembly process thereof is complicated.

Therefore, it is necessary to improve the above technology, so as to address the technical issues.

SUMMARY OF THE INVENTION

It is an object of the present application to provide an electronic expansion valve and a manufacturing method thereof, a thermal management assembly and a cooling system, which have the advantages of high integration, convenient assembly and reduced connection harness.

In order to achieve the above object, an electronic expansion valve is provided according to the present application, which includes a valve core assembly, an electronic control portion and a stator assembly. The valve core assembly includes a valve seat, a valve core and a rotor assembly, the valve seat is provided with a valve port, and the valve core can move relative to the valve seat and change the opening of the valve port. The electronic control portion can control the stator assembly. The rotor assembly can drive the valve core to move. The electronic expansion valve further includes a sensor, and the sensor is a temperature sensor or a pressure sensor or a temperature and pressure sensor. The electronic control portion includes an electronic control board, and the stator assembly and the sensor are electrically connected with the electronic control board.

The sensor includes a body, a sensing head and a pin. The sensing head and the pin are respectively arranged at two ends of the sensor body, and the pin is electrically connected with the electronic control board directly.

The electronic control portion further includes a cover body. The cover body is provided with an inner cavity, and the electric control board is arranged in the inner cavity. The cover body includes an upper housing and a lower housing, and the upper housing and the lower housing are separately formed and are fixedly connected with each other. The lower housing is provided with a through hole, at least the pin can pass through the through hole, and the sensor is welded to the lower housing in a sealing manner at the position of the through hole.

The sensor body includes a guiding portion and a main body portion, a diameter of the guiding portion is smaller than a diameter of the main body portion, and a stepped surface is formed between the guiding portion and the main body portion. A diameter of the through hole is smaller than the diameter of the main body portion, the guiding portion is connected with the pin, and the guiding portion is located between the main body portion and the pin. Both the guiding portion and the pin pass through the through hole, entering the inner cavity of the cover body, and the stepped surface limits a distance at which the sensor extends into the inner cavity of the cover body. The main body portion is welded to the lower housing in a sealing manner.

The electronic expansion valve further includes a valve body, and the valve body includes a first inlet, a first outlet, a second inlet and a second outlet. A first channel is formed between the first inlet and the first outlet, and a second channel is formed between the second inlet and the second outlet. At least part of the valve seat is arranged in the first channel or a first chamber in communication with the first channel, and the sensing head is located in the second channel or a second chamber in communication with the second channel. The sensor is directly welded to and fixedly connected to the valve body in a sealing manner, or the sensor is fixedly connected to the valve body in a sealing manner through a first position-limiting portion. The first position-limiting portion can at least limit the rotation of the sensor relative to the valve body.

The first position-limiting portion includes an intercommunicating hole and an external-thread segment, the main body portion of the sensor can pass through the intercommunicating hole, and the valve body includes an internal-thread segment at a position corresponding to the second chamber. The sensor body further includes a flange portion, the flange portion is located between the main body portion and the pin, an outer diameter of the flange portion is larger than the outer diameter of the main body portion, the flange portion cannot pass through the intercommunicating hole, a lower end surface of the flange portion is in contact with the valve body, and the first position-limiting portion is arranged around the periphery of the main body portion and is limited by the flange portion. The external-thread segment is in threaded connection with the internal-thread segment.

A sealing ring is arranged between the sensor and the valve body. The sensor body further includes a connecting portion, and the connecting portion is located between the flange portion and the sensing head. A diameter of the connecting portion is smaller than the diameter of the main body portion, the connecting portion and the lower end surface of the flange portion form a stepped portion, and the sealing ring is arranged between the lower end surface of the flange portion and the valve body.

The electronic expansion valve further includes a position-limiting pin. The valve body is provided with a first mounting portion, the flange portion is provided with a second mounting portion, and the position-limiting pin is mounted between the first mounting portion and the second mounting portion. The position-limiting pin defines a mounting position of the sensor relative to the valve body.

The first position-limiting portion includes a circlip and a position-limiting pin. The valve body is provided with an annular groove, the sensor body includes the flange portion, and the circlip can be embedded in the annular groove. The circlip limits an upward movement of the flange portion relative to the valve body, and the lower end surface of the flange portion is in contact with the valve body. The valve body includes a first mounting portion, the flange portion includes a second mounting portion, and the position-limiting pin is arranged between the first mounting portion and the second mounting portion.

The sealing ring is arranged between the sensor and the valve body. The sensor body further includes the connecting portion, and the connecting portion is located between the main body portion and the sensing head. The diameter of the connecting portion is smaller than the diameter of the main body portion, the connecting portion is provided with an annular groove, and the sealing ring is located in the annular groove.

The lower housing is fixed to the stator assembly by injection molding. The electronic control portion and the stator assembly may be arranged side by side on a same side of the valve body, the electronic control board may be perpendicular to the sensor, and the sensor may be parallel to a central axis of the valve core.

The lower housing is fixed to the stator assembly by injection molding. The electronic control portion may be arranged in parallel with the stator assembly on a same side of the valve body, the electronic control board may be perpendicular to the sensor, and the sensor may be parallel to a central axis of the valve core.

A thermal management assembly is further disclosed according to the present application, which includes an electronic expansion valve and a heat exchanger. The electronic expansion valve and the heat exchanger are connected with each other, forming an integrated unit. The electronic expansion valve includes a first inlet, a second inlet, a first outlet and a second outlet. The electronic expansion valve includes a valve core assembly, a stator assembly, an electronic control portion and a sensor. The valve core assembly includes a valve seat, a valve core and a rotor assembly, wherein at least part of the valve seat is arranged between the first inlet and the first outlet, the valve core cooperates with the valve seat to change a flow rate of a working medium in the first channel, the electronic control portion includes an electronic control board, the sensor includes a main body portion, a sensing head and a pin, the sensing head is arranged in a second channel between the second inlet and the second outlet or the sensing head is arranged in a second chamber in communication with the second channel, and the pin is electrically connected with the electronic control board.

The heat exchanger includes a third channel and a fourth channel, the third channel is not in communication with the fourth channel, and the first channel may be in communication with the second channel through the third channel.

The heat exchanger includes a third channel and a fourth channel, the third channel is not in communication with the fourth channel, the first channel may be in communication with the third channel, and the second channel may be in communication with the fourth channel.

A method for manufacturing an electronic expansion valve is further disclosed according to the present application. The electronic expansion valve includes a stator assembly, an electronic control portion, a valve core assembly, a sensor and a valve body. The valve core assembly includes a valve core, a valve seat and a rotor assembly. The electronic control portion includes an electronic control board and a cover body. The method includes the following steps.

In step a1, the valve core assembly is mounted to the valve body;

In step a2, the sensor is fixed to the valve body;

In step a3, the stator assembly is fixed to the valve body;

In step a4, the electronic control board is installed, and the electronic control board is electrically connected with the stator assembly and the sensor; and In step a5, the cover body used for accommodating the electronic control board is sealed.

A cooling system is further disclosed according to the present application, which includes a compressor, an evaporator, a condenser and a first electronic expansion valve. The first electronic expansion valve is arranged between the condenser and the evaporator, wherein the first electronic expansion valve includes a valve core assembly, a stator assembly, an electronic control portion and a sensor, the valve core assembly includes a valve core, a valve seat and a rotor assembly, and the electronic control portion includes an electronic control board. The first electronic expansion valve includes a first inlet, a second inlet, a first outlet and a second outlet, wherein a first channel is formed between the first inlet and the first outlet, and a second channel is formed between the second inlet and the second outlet. At least part of the valve seat is arranged in the first channel or in a first chamber in communication with the first channel. The valve core cooperates with the valve seat to change a flow rate of a refrigerant in the first channel. The sensor includes a main body portion, a sensing head and a pin, the sensing head is arranged in the second channel or in a second chamber in communication with the second channel, the pin is electrically connected with the electronic control board directly, and the evaporator is in communication with the first channel and the second channel.

The cooling system further includes a battery cooling system. The battery cooling system includes a thermal management assembly. The thermal management assembly includes a heat exchanger and a second electronic expansion valve. The second electronic expansion valve is integrated with the heat exchanger. The second electronic expansion valve includes a valve core assembly, a stator assembly, an electronic control portion and a sensor, the valve core assembly includes a valve core, a valve seat and a rotor assembly, and the electronic control portion includes an electronic control board. The second electronic expansion valve includes a first inlet, a second inlet, a first outlet and a second outlet, wherein a first channel is formed between the first inlet and the first outlet, and a second channel is formed between the second inlet and the second outlet. At least part of the valve seat is arranged in the first channel or in a first chamber in communication with the first channel. The valve core cooperates with the valve seat to change a flow rate of a refrigerant in the first channel. The sensor includes a main body portion, a sensing head and a pin, the sensing head is arranged in the second channel or in a second chamber in communication with the second channel, and the pin is electrically connected with the electronic control board directly. The heat exchanger includes a third channel and a fourth channel that are isolated from each other, and the first channel is in communication with the second channel through the third channel, or the first channel is in communication with the third channel, and the second channel is in communication with the fourth channel.

Compared with the conventional technology, the electronic expansion valve is integrated with the sensor. Through directly connecting the sensor with the electronic control board, the sensor is integrated with the electronic expansion valve to form a whole, thereby reducing the connection harness and facilitating assembly.

DETAIL DESCRIPTION OF EMBODIMENTS

The present application is further illustrated hereinafter in conjunction with drawings and specific embodiments.

A cooling system is mainly applied to vehicles or household equipment, and the following is described with a vehicle cooling system as an example. The vehicle cooling system at least includes an air conditioning system. Apparently, as the battery is applied to vehicles, the vehicle cooling system may also include a battery cooling system. When the cooling system is in operation, the air conditioning system includes circulating refrigerants, and the battery cooling system includes a circulating working medium, wherein the working medium may be water, oil, a mixture containing water or oil, a refrigerant, or the like.

Figure 1:
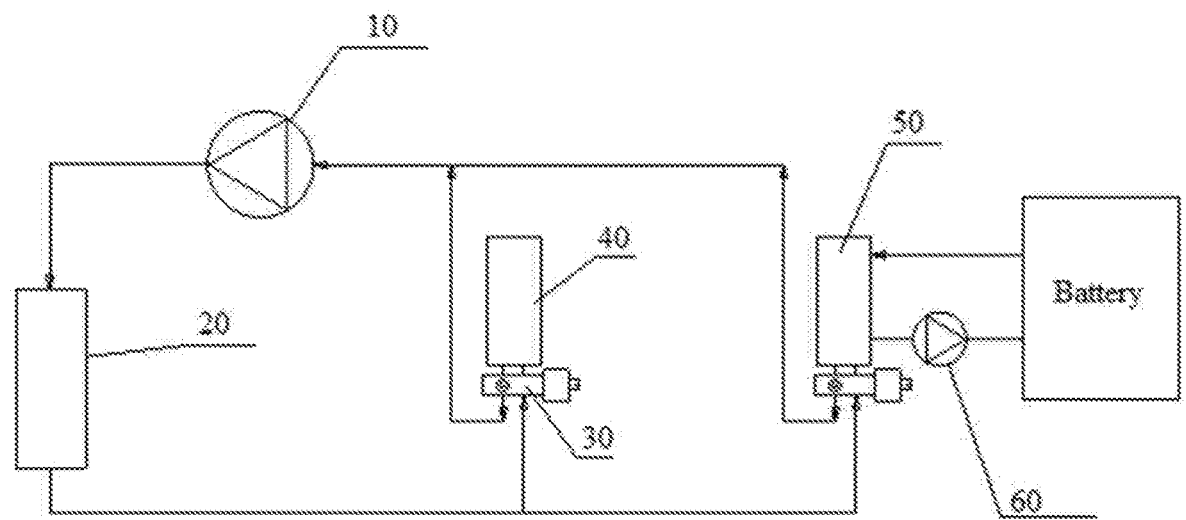
FIG. 1 is a schematic view of an embodiment of a cooling system.

FIG. 1 is a schematic view of an embodiment of a cooling system. In the present embodiment, the cooling system includes an air conditioning system and a battery cooling system. The air conditioning system includes a compressor 10, a condenser 20, a first electronic expansion valve 30 and an evaporator 40. When the air conditioning system is in operation, the refrigerant is compressed into a high temperature and high pressure refrigerant by the compressor 10, then the high temperature and high pressure refrigerant is cooled by the condenser 20 to become a normal temperature and high pressure refrigerant, and then the normal temperature and high pressure refrigerant passes through the first electronic expansion valve 30 and enters the evaporator 40. Since the pressure of the normal temperature and high pressure refrigerant decreases after passing through the first electronic expansion valve 30, the refrigerant vaporizes and becomes a low temperature refrigerant, and the low temperature refrigerant absorbs a large amount of heat through the evaporator 40 and returns to the compressor 10. The battery cooling system includes a thermal management assembly 50 and a pump 60, the refrigerant in the air conditioning system exchanges heat with the working medium of the battery cooling system in the thermal management assembly 50, and the pump 60 provides power for the circulating motion of the working medium of the battery cooling system.

Figure 2:
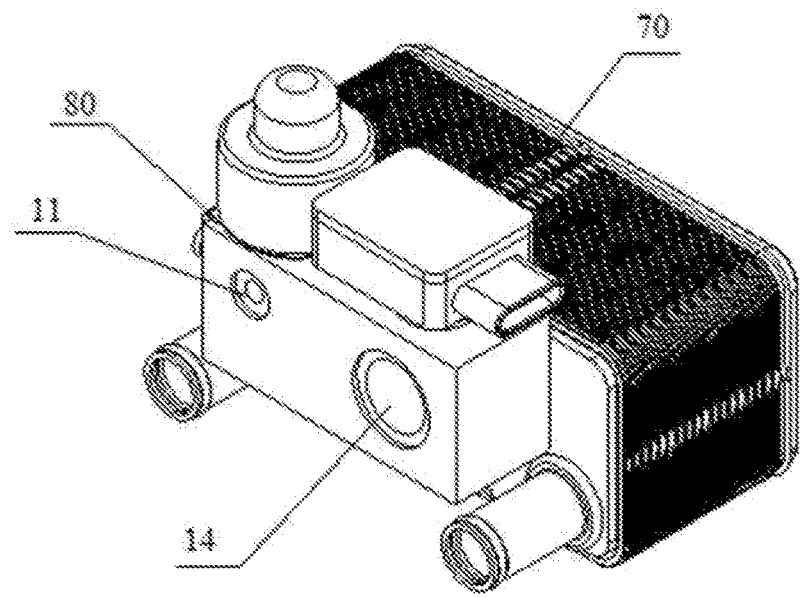
FIG. 2 is a schematic structural view of an embodiment of a thermal management assembly.

FIG. 2 is a schematic structural view of a specific embodiment of the thermal management assembly 50. In the present embodiment, the thermal management assembly 50 includes a heat exchanger 70 and a second electronic expansion valve 80, and the heat exchanger 70 is integrated with the second electronic expansion valve 80 to form a whole. The refrigerant of the air conditioning system exchanges heat with the working medium of the battery cooling system in the heat exchanger 70. In the present embodiment, a structure of the first electronic expansion valve 30 is the same as that of the second electronic expansion valve 80, and the first electronic expansion valve 30 and the second electronic expansion valve 80 are collectively referred to as the electronic expansion valve to describe hereinafter. Obviously, the structure of the first electronic expansion valve may be different from that of the second electronic expansion valve, or the battery cooling system may not be provided with the electronic expansion valve. A technical solution falls within the scope of protection of the present application, as long as one of the first electronic expansion valve and the second electronic expansion valve of the technical solution has the same structure as the electronic expansion valve of the present application.

Figure 3:
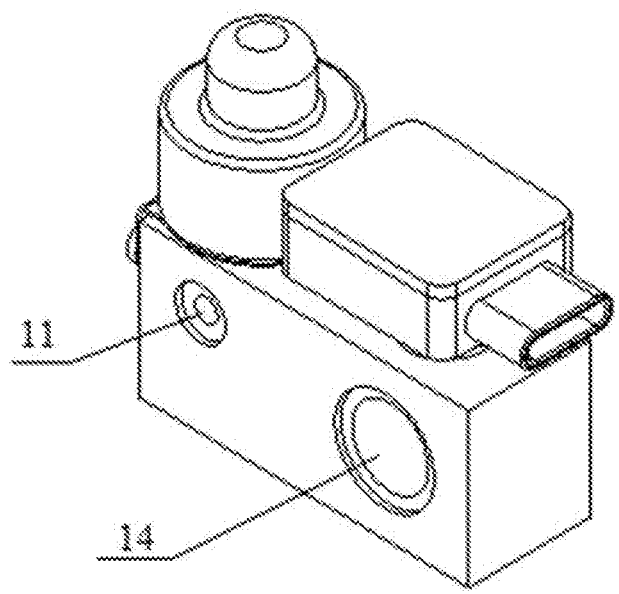
FIG. 3 is a schematic perspective view of an electronic expansion valve viewed from one direction.
Figure 4:
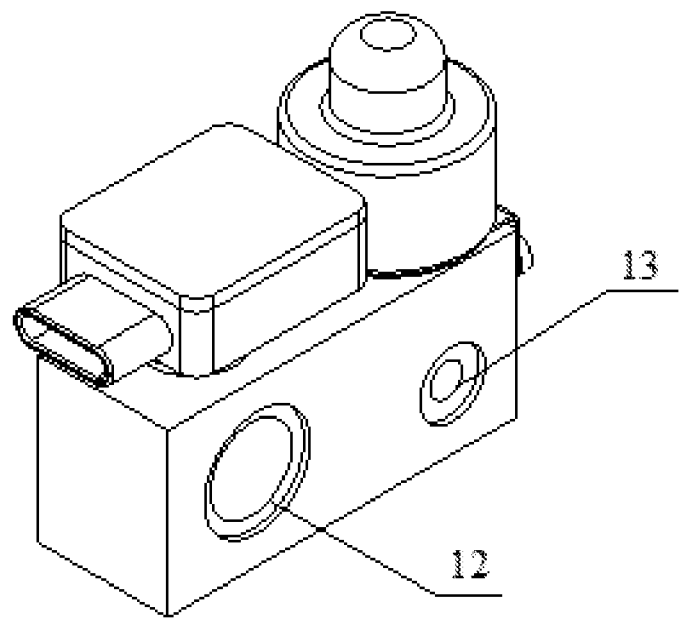
FIG. 4 is a schematic perspective view of the electronic expansion valve viewed from another direction.
Figure 5:
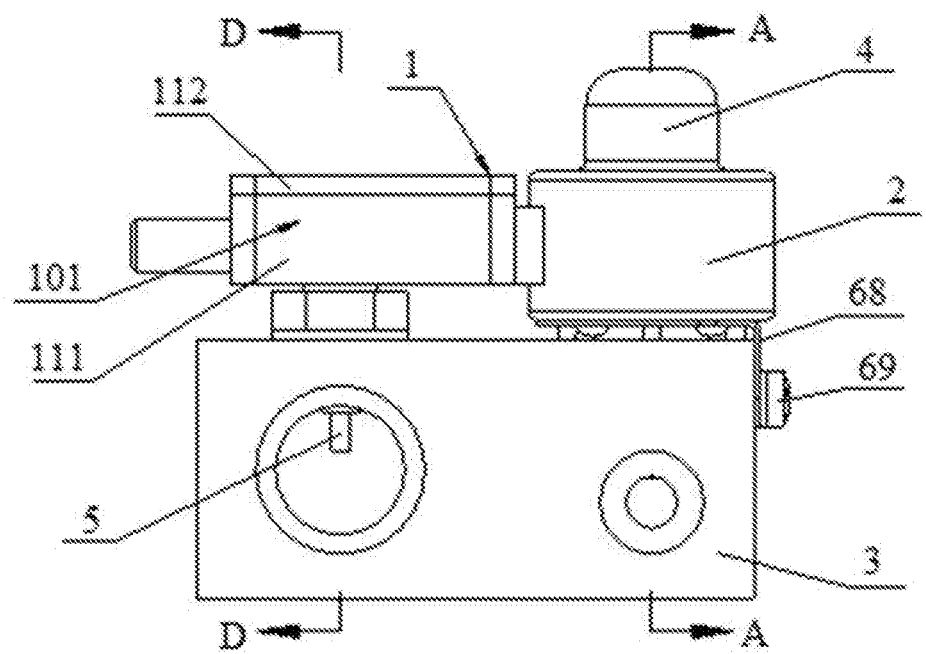
FIG. 5 is a front view showing the structure of a first embodiment of the electronic expansion valve.
Figure 6:
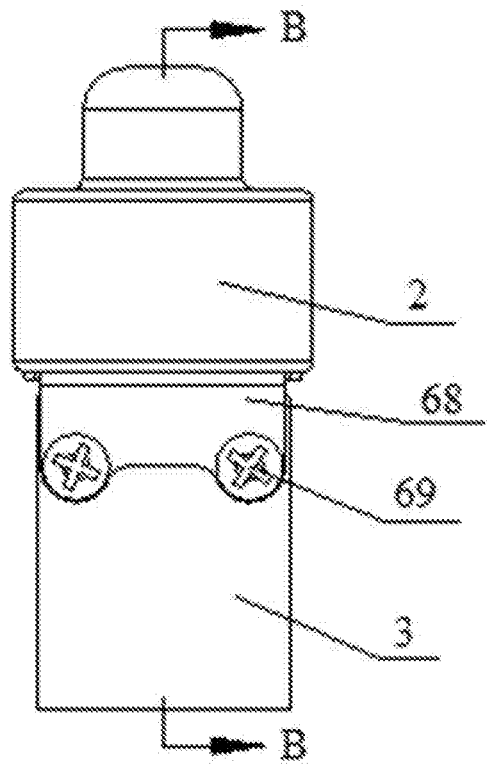
FIG. 6 is a right side view showing the structure of the electronic expansion valve in FIG. 5.
Figure 7:
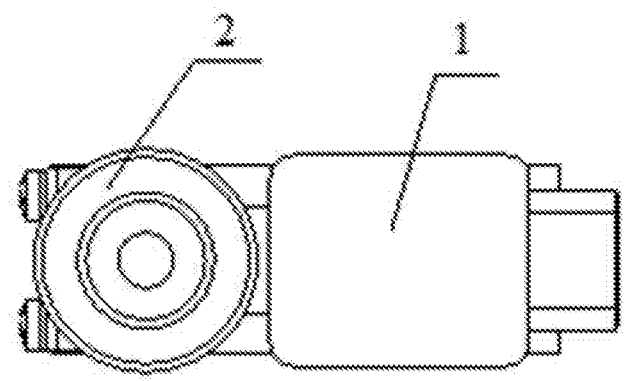
FIG. 7 is a top view showing the structure of the electronic expansion valve in FIG. 5.

In conjunction with FIGS. 3 and 4, the electronic expansion valve is provided with a first inlet 11, a second inlet 12, a first outlet 13 and a second outlet 14. A first channel is provided between the first inlet 11 and the first outlet 13, and a second channel is provided between the second inlet 12 and the second outlet 14. The electronic expansion valve includes a sensor, the sensor includes a sensing head, the sensing head is arranged in the second channel or a cavity in direct communication with the second channel, such that the sensor can detect a temperature or a pressure or a temperature and a pressure of the refrigerant or working medium in the second channel. The sensor is a temperature sensor or a pressure sensor or a temperature and pressure sensor, that is, the sensor can detect the temperature, or the pressure, or both the pressure and temperature.

As for the air conditioning system, the evaporator 40 includes a third channel and a fourth channel, the first channel is in communication with the third channel, the third channel is in communication with the fourth channel, and the fourth channel is in communication with the second channel. The sensor can detect the temperature or the pressure or both the temperature and pressure of the refrigerant in the second channel.

As for the battery cooling system, the heat exchanger 70 includes a third channel and a fourth channel (not shown in the drawings), the third channel is not in communication with the fourth channel, and the first channel and the second channel of the electronic expansion valve may be connected with the third channel and the fourth channel of the heat exchanger 70 in the following at least two connection modes.

In a first connection mode, the first channel is in communication with the second channel through the third channel, at this time, what flows in the first channel, the second channel and the third channel is the refrigerant, and what flows in the fourth channel is the working medium;

In a second connection mode, the first channel is in communication with the third channel, and the second channel is in communication with the fourth channel, at this time, it is the refrigerant that flows in the first channel and the third channel, and the working medium that flows in the second channel and the fourth channel.

In a case that the channels of the electronic expansion valve communicate with the channels of the heat exchanger in the first mode, that is, the first channel is in communication with the second channel through the third channel, the sensor detects the working pressure or the temperature or both the pressure and temperature of the refrigerant in the second channel. In a case that the channels of the electronic expansion valve communicate with the channels of the heat exchanger in the second mode, that is, the first channel is in communication with the third channel, and the second channel is in communication with the fourth channel, the sensor detects the temperature or the pressure or both the temperature and pressure of the working medium in the second channel. In the present embodiment, the electronic expansion valve includes the sensor, and part of the channels is formed in the electronic expansion valve, which reduces the connection points between the components and the pipelines and is advantageous for simplifying the assembly process and improving the sealing performance of the system. In the present embodiment, the electronic expansion valve can detect the pressure and temperature parameters of the refrigerant or the pressure and temperature parameters of the working medium according to the different connection modes of the pipelines, which is advantageous for improving the versatility of the electronic expansion valve.

Figure 8:
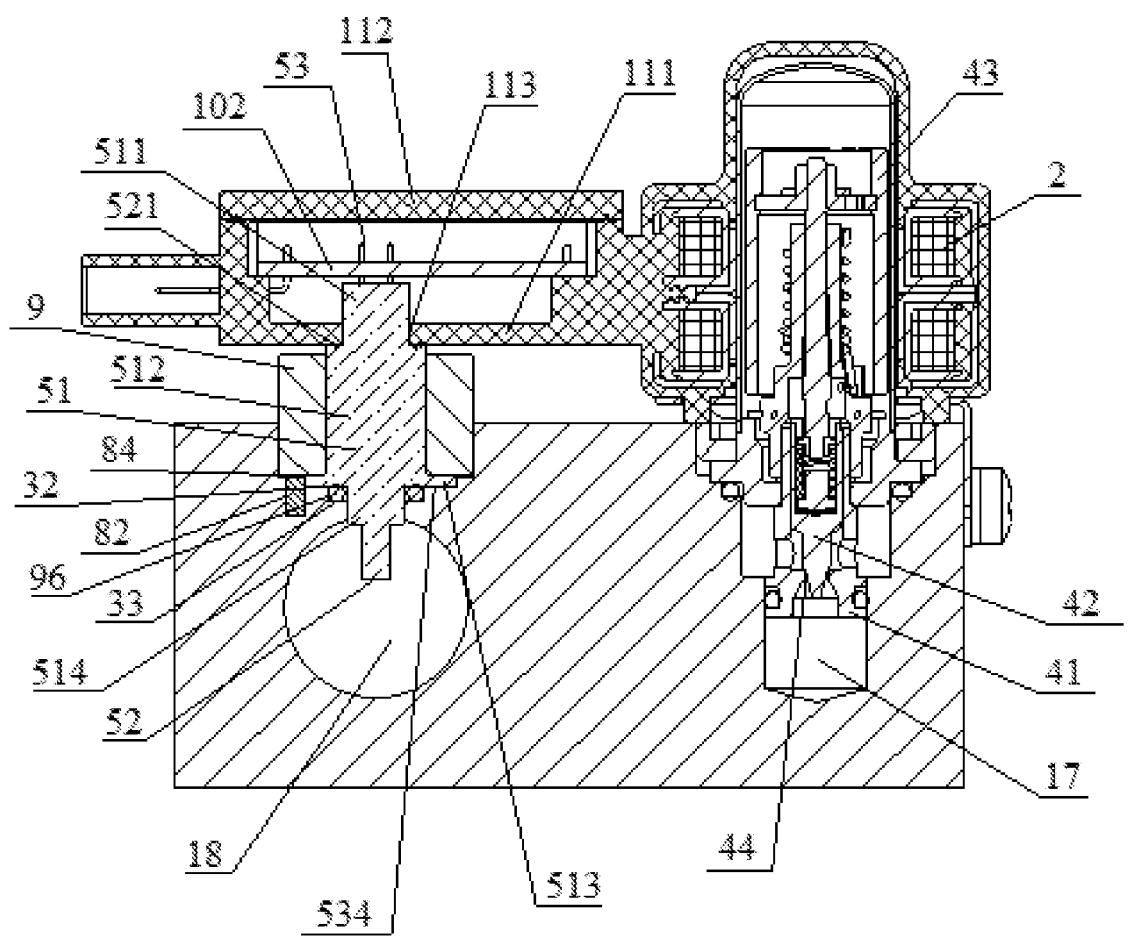
FIG. 8 is a cross-sectional view showing the structure of the electronic expansion valve in FIG. 6 taken along the line B-B.
Figure 9:
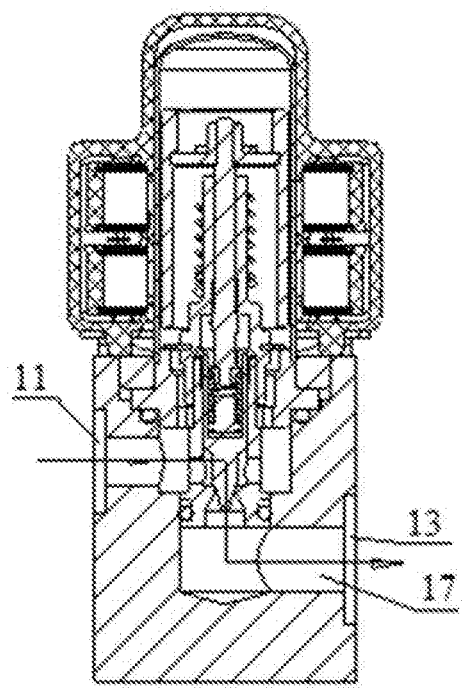
FIG. 9 is a cross-sectional view showing the structure of the electronic expansion valve in FIG. 5 taken along the line A-A.
Figure 10:
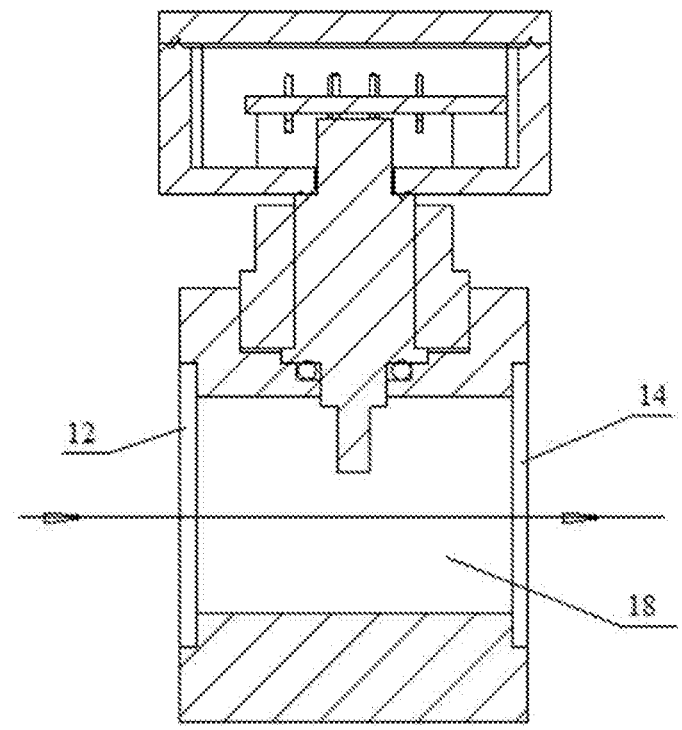
FIG. 10 is a cross-sectional view showing the structure of the electronic expansion valve in FIG. 5 taken along the line D-D.

FIGS. 5 to 10 are schematic structural views of the first embodiment of the electronic expansion valve. The electronic expansion valve includes an electronic control portion 1, a stator assembly 2, a valve body 3, a valve core assembly 4, and a sensor 5. In the present embodiment, the electronic control portion 1 and the stator assembly 2 are arranged side by side on a same side of the valve body 3, that is, the stator assembly 2 is not arranged between the valve body 3 and the electric control portion 1, which utilizes the space alongside the stator assembly and is advantageous for a compact structure of the electronic expansion valve to miniaturize a radial size of the electronic expansion valve. Both the electronic control portion 1 and the stator assembly 2 are fixedly connected with the valve body 3. As shown in FIG. 8, the sensor 5 can be arranged in parallel with a central axis of a valve core 42. The electronic expansion valve further includes a pressure plate 68, a section of the pressure plate 68 is substantially L-shaped, a portion of the pressure plate 68 is fixedly connected with the stator assembly 2, and another portion of the pressure plate 68 is fixedly connected with the valve body 3 by screws 69, so that the stator assembly 2 and the valve body 3 are fixed by the pressure plate.

The electronic control portion 1 includes a cover body 101 and an electronic control board 102 (refer to FIG. 8 and the like). The cover body 101 forms an inner cavity, and the electronic control board 102 is arranged in the inner cavity. The cover body 101 includes a lower housing 111 and an upper housing 112, the lower housing 111 and the upper housing 112 are separately formed, the lower housing 111 and the stator assembly 2 are integrally injection molded in the present embodiment, and the upper housing 112 is fixedly connected with the lower housing 111 by ultrasonic welding. The electronic control board 102 is provided with electrical elements and circuits (not shown in the drawings), so that the electronic control board 102 can be electrically conductive. In the present embodiment, the lower housing 111 is formed with a through hole 113, and the sensor 5 passes through the through hole 113 and enters the inner cavity of the cover body to be electrically connected to the electronic control board 102. Both the stator assembly 2 and the sensor 5 are electrically connected to the electronic control board 102 directly, so that the sensor 5 is integrated into the electronic expansion valve, and the function of the electronic expansion valve is more perfect. Moreover, the electronic expansion valve provides a mounting and fixing structure for the sensor, which is advantageous for the fixation of the sensor. In addition, the connection points of the electronic expansion valve to the cooling system are reduced, which is advantageous for improving the sealing performance of the cooling system.

Referring to FIG. 8, the valve core assembly 4 includes a valve seat 41, a valve core 42 and a rotor assembly 43, the valve seat 41 is fixed relative to the valve body 3, the valve seat 41 is provided with a valve port 44, the valve core 42 moves relative to the valve seat 41 and controls the opening of the valve port 44, and the electronic control portion 1 controls the movement of the valve core 42 by controlling the stator assembly 2 and the rotor assembly 43.

In the present embodiment, the sensor 5 includes a body 51, a sensing head 52 and a pin 53, and the sensing head 52 and the pin 53 are arranged at two ends of the body 51, respectively. The sensing head 52 is configured to sense the temperature or the pressure or the temperature and pressure of the environment, and the pin 53 is electrically connected with the electronic control board 102. In the present embodiment, the pin 53 is a press-fit pin, so that the pin 53 is electrically connected to the electronic control board 102 by a press fit. Thus, the sensor 5 can be assembled to the electronic control board 102 without welding, as long as a jack of the electronic control board 102 is matched with and pressed to fit with the pin 53, which can simply the process while avoiding the situation of cold solder joint.

Figure 17:
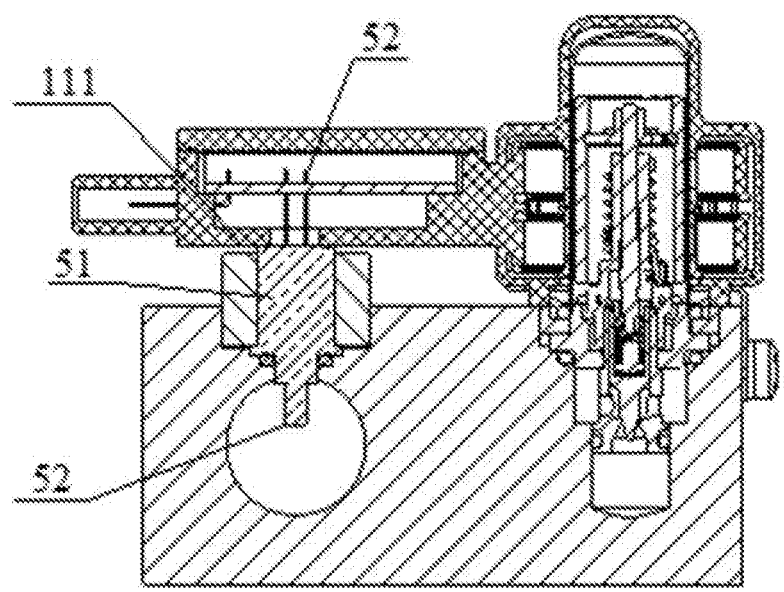
FIG. 17 is a schematic cross-sectional view showing the structure of a fifth embodiment of the electronic expansion valve.

In the present embodiment, the sensor body 51 includes a guiding portion 511 and a main body portion 512, the guiding portion 511 is connected with the pin 53, and an outer diameter of the guiding portion 511 is smaller than an outer diameter of the main body portion 512, such that a first stepped surface 521 is formed between the guiding portion 511 and the main body portion 512. The guiding portion 511 and the pin 53 extend through the through hole 113 into the inner cavity of the cover body, and the first stepped surface 521 limits a distance at which the sensor body 51 extends into the inner cavity of the cover body. The first stepped surface 521 is in contact with an outer surface of the lower housing 11 and is fixed thereto by ultrasonic welding to form a seal. The arrangement of the guiding portion 511 extending into the inner cavity of the cover body avoids a situation in which the length of the pin 53 is too long to be easily connected with the electronic control board 102 and the connection strength is thereby reduced. Obviously, in a case that the connection between the sensor 5 and the electronic control board 102 is not affected, the guiding portion may not be provided, so that only the pin 53 extends into the inner cavity of the cover body as shown in FIG. 17. With such an arrangement, the sensor body 51 may not include the guiding portion, which is advantageous for reducing the cost of the sensor 5, and the strength of the pin 53 is not affected when the electric control board 102 is close to the outer surface of the lower housing 111. With such a structure, only the pin 53 needs to pass through hole 113 of the lower housing 111, and the sealing of the through hole 113 is achieved by welding.

The sensor body 51 further includes a flange portion 513 and a connecting portion 514, the connecting portion 514 is connected with the sensing head 52, and the flange portion 513 is arranged between the main body portion 512 and the connecting portion 514. In the present embodiment, an outer diameter of the flange portion 513 is larger than the outer diameter of the main body portion 512, an outer diameter of the connecting portion 514 is smaller than the outer diameter of the main body portion 512, and a second stepped surface 534 is formed between the connecting portion 514 and a lower end surface of the flange portion 513. The sensor body 51 is connected with the valve body 3.

Figure 21:
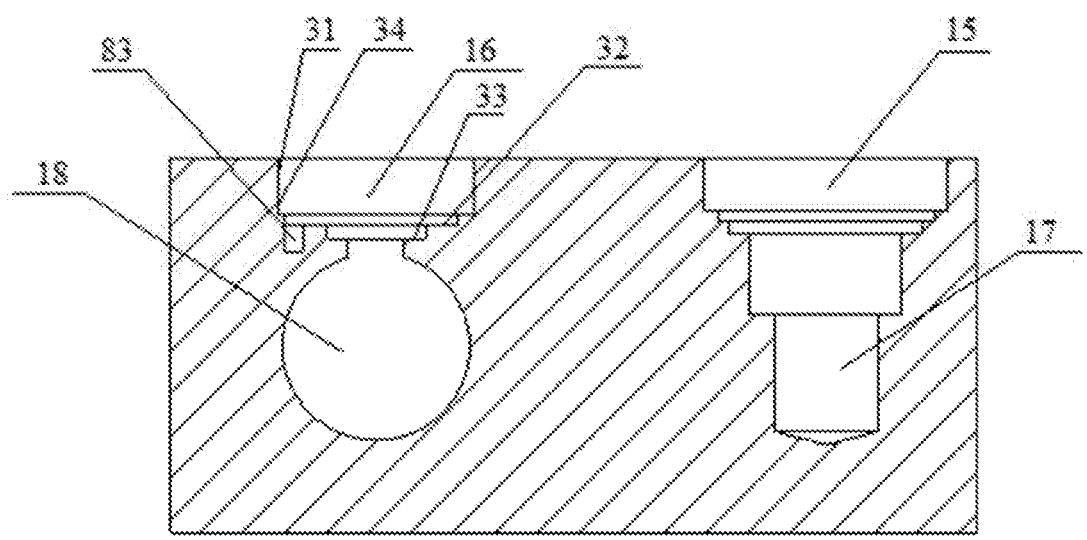
FIG. 21 is a schematic structural view of a valve body of the first embodiment of the electronic expansion valve.

In conjunction with FIGS. 3, 4 and 21, the valve body 3 includes the first inlet 11, the first outlet 13, the second inlet 12, the second outlet 14, a first chamber 15, and a second chamber 16. The first channel 17 is formed between the first inlet 11 and the first outlet 13, and the second channel 18 is formed between the second inlet 12 and the second outlet 14. The first inlet 11 and the second outlet 14 are located on a same side of the valve body 3, and the first outlet 13 and the second inlet 12 are located on a same side of the valve body 3 to ensure a smooth flow of the refrigerant. The valve core 42 is arranged in the first chamber 15 in communication with the first channel 17, and at least the sensing head 52 of the sensor 5 is located in the second chamber 16 in communication with the second channel 18.

In the present embodiment, corresponding to the second chamber 16, the valve body 3 includes a first side wall 31, a first bottom portion 32, a second bottom portion 33, and the first side wall 31 is provided with an internal-thread segment 34.

The electronic expansion valve further includes a first position-limiting portion 9. The first position-limiting portion 9 limits at least the movement of the sensor 5 relative to the valve body 3 along an axial direction of the sensor 5. In the present embodiment, the first position-limiting portion 9 includes an intercommunicating hole 91 and an external-thread segment 92. The main body portion 512 of the sensor can pass through the intercommunicating hole 91, while the flange portion 513 cannot pass through the intercommunicating hole 91. The lower end surface of the flange portion 513 is in contact with the first bottom portion 32 of the valve body 3, the first position-limiting portion 9 is arranged around a periphery of the main body portion 512 and is limited by the flange portion 513, and the external-thread segment 92 is in threaded connection with the internal-thread segment 34, such that the sensor is fixed to the valve body. The reliability of the threaded connection between the sensor and the valve body is higher than other methods, which prevents the sensor of the electronic expansion valve from loosening due to different working conditions during the operation.

In order to improve the sealing between the valve body and the sensor, a sealing ring 96 is arranged between the sensor 5 and the valve body 3. The sealing ring 96 is pressed between the second stepped surface 534 and the second bottom portion 33 of the valve body, which acts as a seal to reduce the risk of leakage of the working medium or the refrigerant in the second channel through the second chamber.

In order to limit the rotation of the sensor relative to the valve body, the electronic expansion valve further includes a second position-limiting portion. The second position-limiting portion includes a position-limiting pin 82, a first mounting portion 83 and a second mounting portion 84. The first mounting portion 83 is a concave portion formed in the first bottom portion 32, the concave portion has a cylindrical shape, and a diameter of an opening portion of the concave portion is slightly larger than a diameter of the position-limiting pin 82. The second mounting portion 83 is a notch formed in the flange portion 513. The concave portion is aligned with the notch portion and then the position-limiting pin 82 is mounted, which is advantageous for limiting the rotation of the sensor relative to the valve body. Since a position of the electronic control board relative to the valve body is fixed, it is convenient to determine a position of the pin relative to the electronic control board.

When the electronic expansion valve in the present embodiment is in operation, the refrigerant enters the first channel 17 through the first inlet 11, the valve seat 41 is arranged in the first chamber 15, and the valve seat 41 is provided with the valve port 44, the valve core 42 controls the opening of the valve port 44 to control the flow rate of the refrigerant in the first channel 17, and the refrigerant leaves the first channel 17 through the first outlet 13; and the refrigerant or working medium enters the second channel 18 through the second inlet 12, the sensing head 52 of the sensor 5 detects the pressure or the temperature or the pressure and temperature parameters in the second channel 18, and feeds the signals back to the electronic control board 102.

Figure 18:
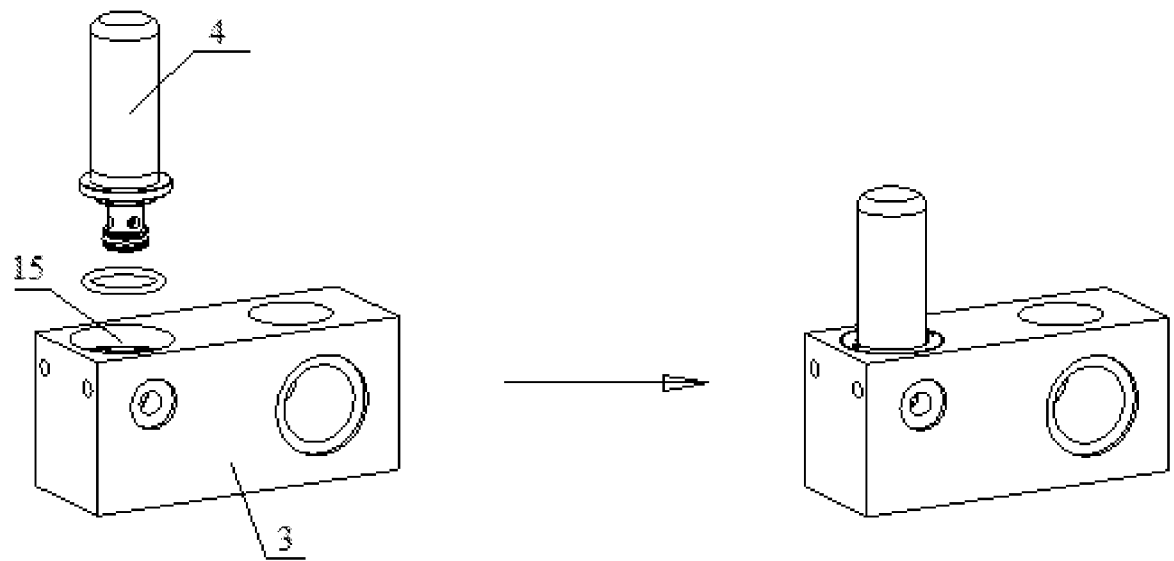
FIG. 18 is schematic view of step 1 of the assembly steps of the electronic expansion valve.
Figure 19:
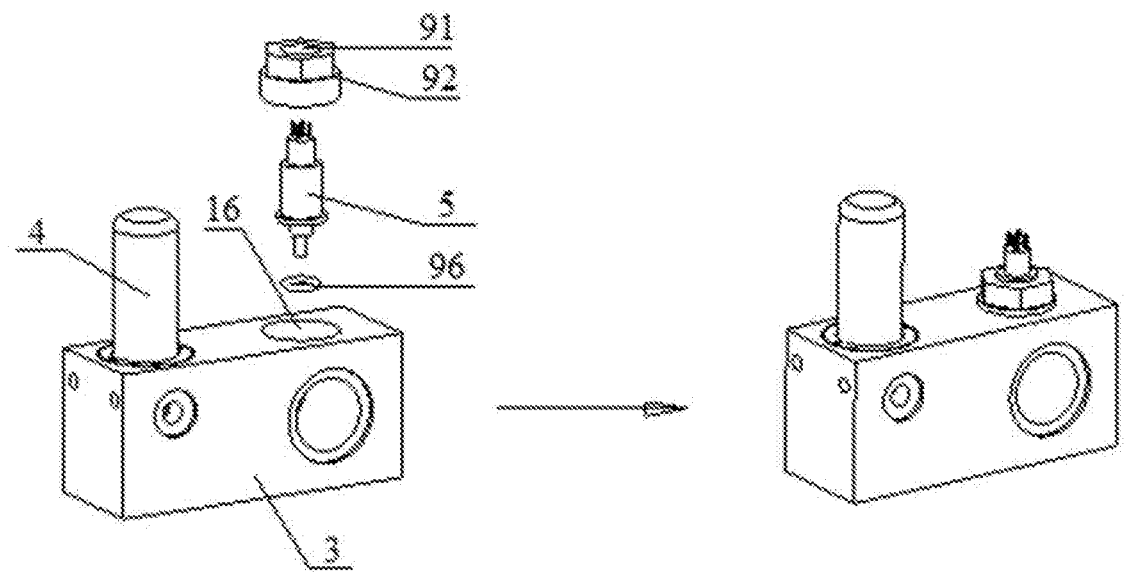
FIG. 19 is schematic view of step 2 of the assembly steps of the electronic expansion valve.
Figure 20:
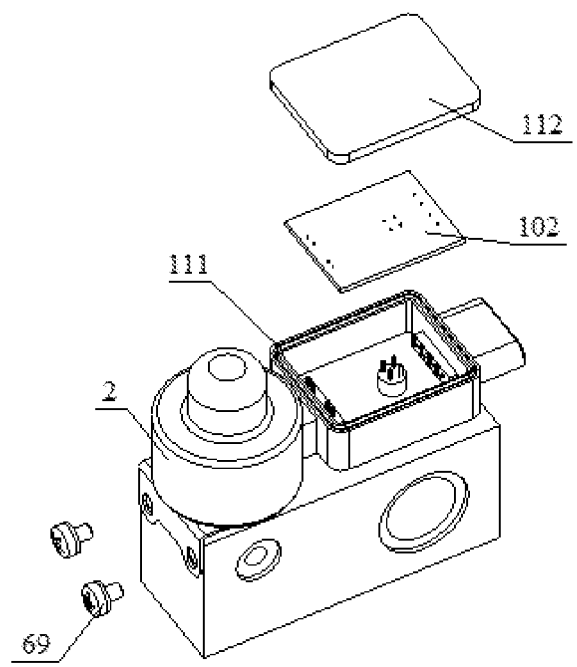
FIG. 20 is schematic view of step 3 of the assembly steps of the electronic expansion valve.

FIGS. 18 to 20 are schematic views of an assembly flow of the first embodiment of the electronic expansion valve. The electronic expansion valve includes the stator assembly, the electronic control portion, the valve core assembly, the sensor and the valve body. The electronic control portion includes the electronic control board and the cover body. The method for manufacturing the electronic expansion valve includes the following steps:

Step a1, mounting the valve core assembly to the valve body;

Step a2, fixing the sensor to the valve body;

Step a3, fixing the stator assembly to the valve body;

Step a4, installing the electronic control board, and electrically connecting the electronic control board with the stator assembly and the sensor; and Step a5, fixing the cover body used for accommodating the electronic control board.

The valve core assembly in step a1 includes the valve core, the valve seat and the rotor assembly, and the step a1 includes assembly of the valve core assembly.

Step a2 further includes mounting the position-limiting pin, that is, first placing the position-limiting pin in the valve body, then placing the sensor at the first bottom portion of the valve body, fitting the first position-limiting portion, and threadedly connecting the first position-limiting portion with the valve body.

Step a2 further includes placing the sealing ring at the second bottom portion before placing the sensor.

Figure 11:
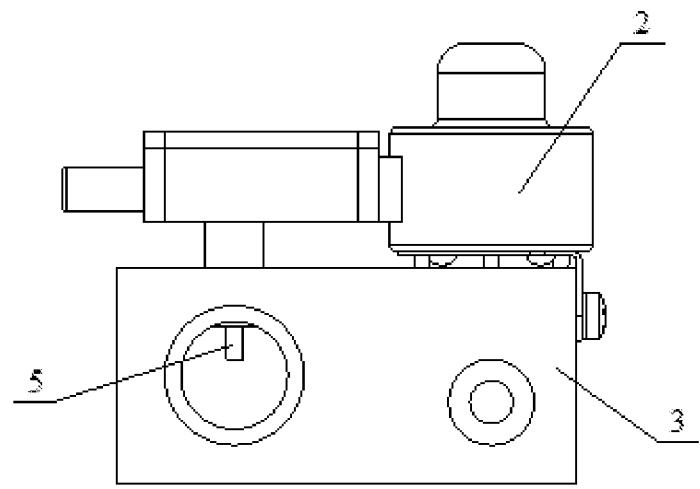
FIG. 11 is a front view showing the structure of a second embodiment of the electronic expansion valve.
Figure 12:
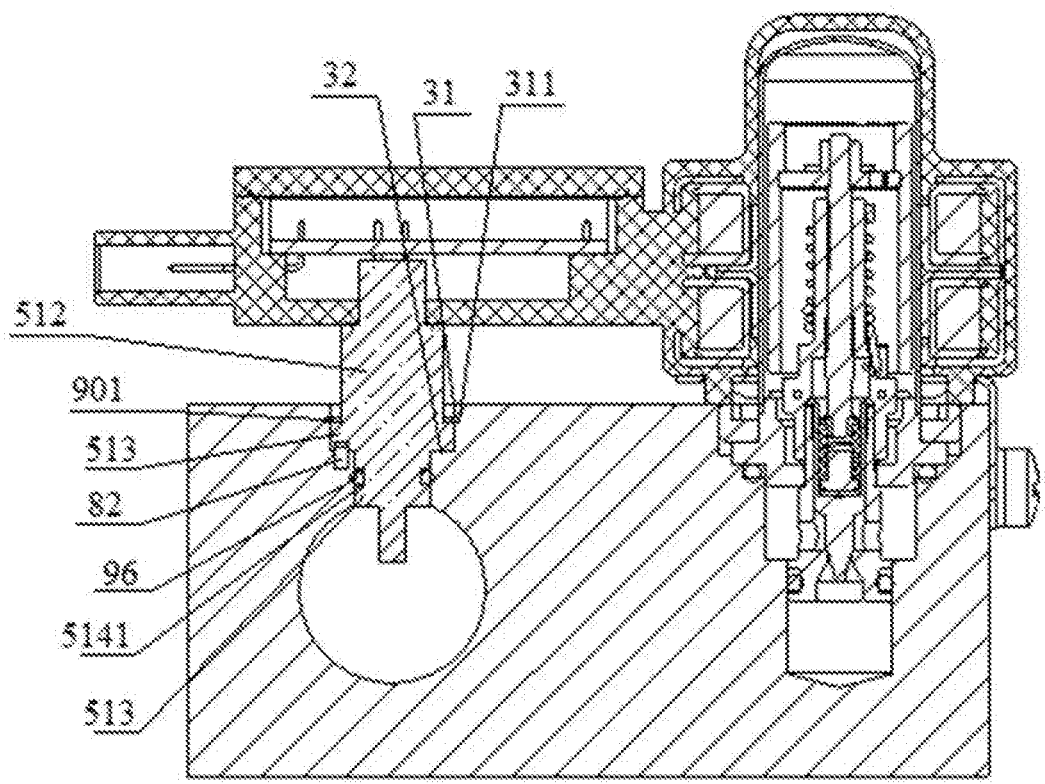
FIG. 12 is a schematic cross-sectional view showing the structure of the second embodiment of the electronic expansion valve.

FIGS. 11 to 12 are schematic structural views of the second embodiment of the electronic expansion valve. Compared with the first embodiment, the main differences are as follows: the valve body 3 corresponding to the second chamber includes the first side wall 31 and the first bottom portion 32; the first side wall 31 is provided with a groove 311, the electronic expansion valve includes the first position-limiting portion 9, and the first position-limiting portion 9 at least limits the movement of the sensor relative to the valve body along the axial direction of the sensor; the first position-limiting portion 9 includes a circlip 901; the lower surface of the flange portion 513 of the sensor 5 is in contact with the first bottom portion 32, the circlip 901 is arranged around the periphery of the main body portion 512, an inner diameter of the circlip 901 is slightly larger than the outer diameter of the main body portion 512 and is smaller than the outer diameter of the flange portion 513, the circlip 901 is embedded in the groove 311 of the first side wall 31, a lower end surface of the circlip 901 is pressed against an upper end surface of the flange portion 513, thus the sensor 5 is pressed against the first bottom portion 32, the sensor 5 is further fixedly connected with the valve body 3 in the axial direction to limit the movement of the sensor relative to the valve body along the axial direction of the sensor. Compared with the first embodiment, the sensor and the valve body are fixed by the circlip in the present embodiment, which is advantageous for reducing the cost while ensuring the strength of the connection.

Same as the first embodiment, in order to limit the rotation of the sensor relative to the valve body, the electronic expansion valve further includes the second position-limiting portion. The second position-limiting portion includes the position-limiting pin 82, the first mounting portion and the second mounting portion. The first mounting portion is a concave portion formed in the first bottom portion 32, the concave portion has a cylindrical shape, and the diameter of the opening portion of the concave portion is slightly larger than the diameter of the position-limiting pin 82. The second mounting portion 8 is a notch formed in the flange portion 513. The concave portion is aligned with the notch portion and then the position-limiting pin 82 is mounted, which is advantageous for limiting the rotation of the sensor relative to the valve body. Since a position of the electronic control board relative to the valve body is fixed, it is convenient to determine a position of the pin relative to the electronic control board.

In addition, in the present embodiment, the connecting portion 514 of the sensor 5 is provided with an annular groove 5141, the sealing ring 96 is arranged in the annular groove 5141, and the sealing ring 96 is pressed and deformed in the radial direction by the sensor 5 and the valve body 3 to form a seal. Such a structure is more convenient for the mounting of the sealing ring 96.

The differences between the manufacturing method of the electronic expansion valve in the present embodiment and the manufacturing method of the electronic expansion valve in the first embodiment are as follows: Step a2 includes installing the position-limiting pin, placing the sensor on the first bottom portion of the valve body, fitting the circlip, and embedding the circlip in the annular groove 5141 of the valve body 3.

Figure 13:
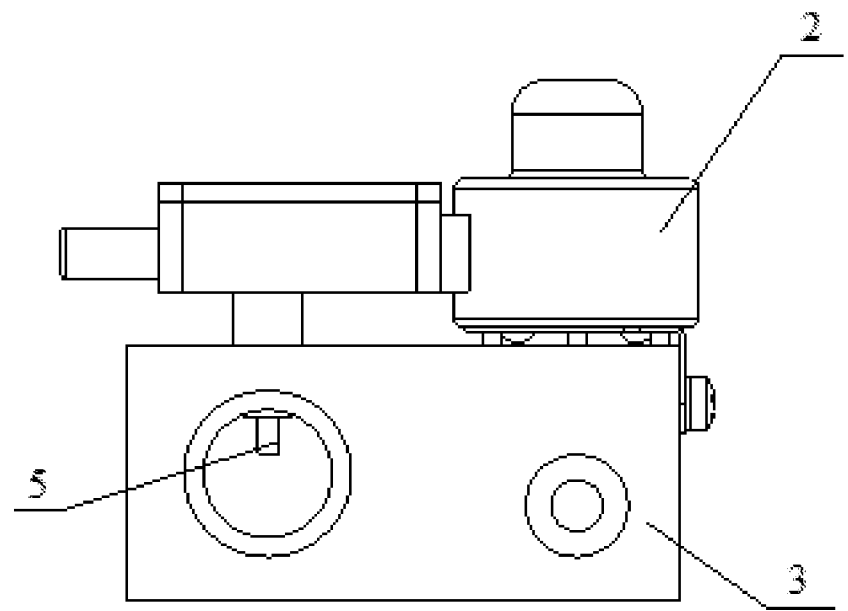
FIG. 13 is a front view showing the structure of a third embodiment of the electronic expansion valve.
Figure 14:
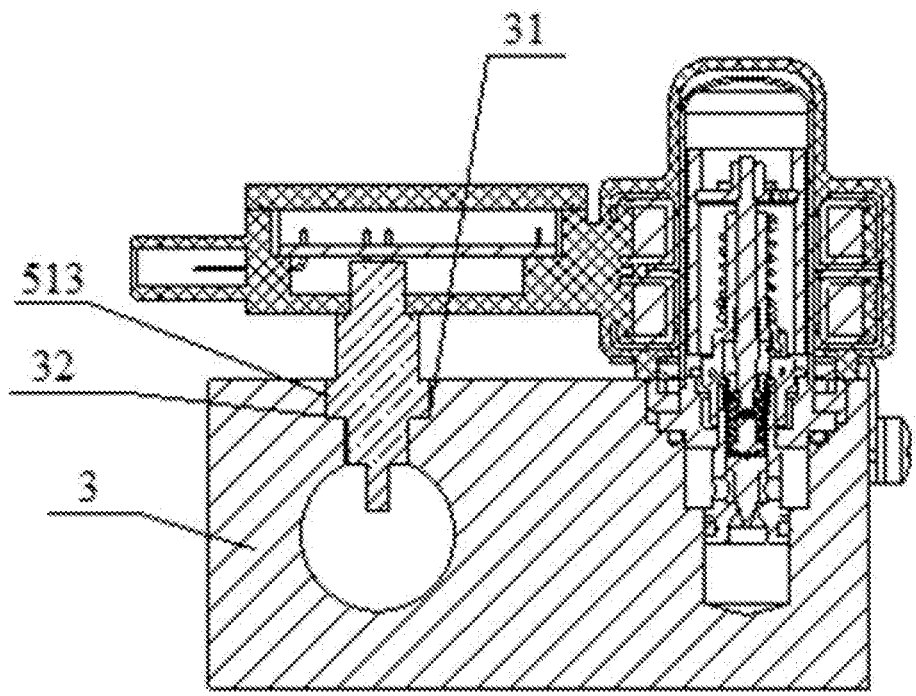
FIG. 14 is a schematic cross-sectional view showing the structure of the third embodiment of the electronic expansion valve.

FIGS. 13 and 14 show a third embodiment of the electronic expansion valve. The main differences between the present embodiment and the second embodiment are as follows: the valve body 3 corresponding to the second chamber includes the first side wall 31 and the first bottom portion 32; the electronic expansion valve includes the first position-limiting portion 9, and the first position-limiting portion 9 at least limits the movement of the sensor relative to the valve body along the axial direction of the sensor; the first position-limiting portion 9 includes welding between the upper surface of the flange portion 513 and the valve body 3; and the lower surface of the flange portion 513 of the sensor is in contact with the first bottom portion 32, and the upper surface of the flange portion 513 is welded to the valve body 3. Compared with the first embodiment, the sensor and the valve body are fixed by welding in the present embodiment, and the second position-limiting portion is no longer required. No additional parts are required, while ensuring the strength of the connection. Moreover, the structure of the product is the simplest, which is advantageous for reducing the cost.

Figure 15:
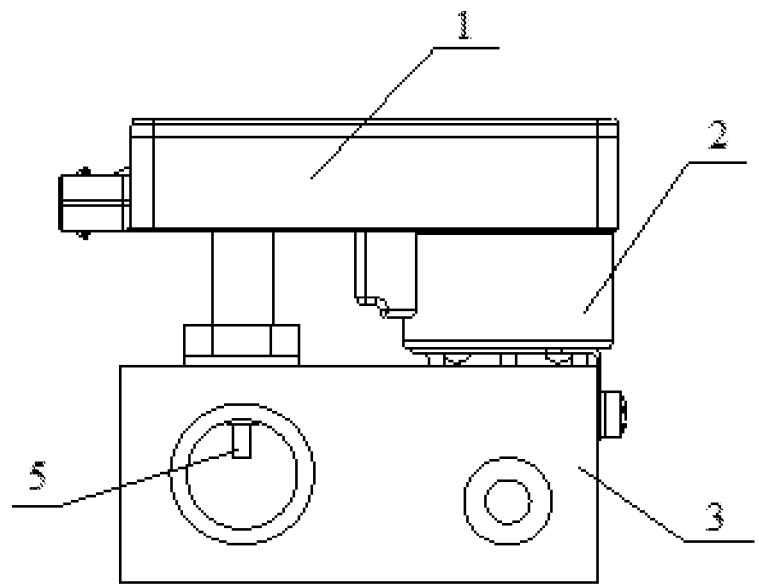
FIG. 15 is a front view showing the structure of a fourth embodiment of the electronic expansion valve.
Figure 16:
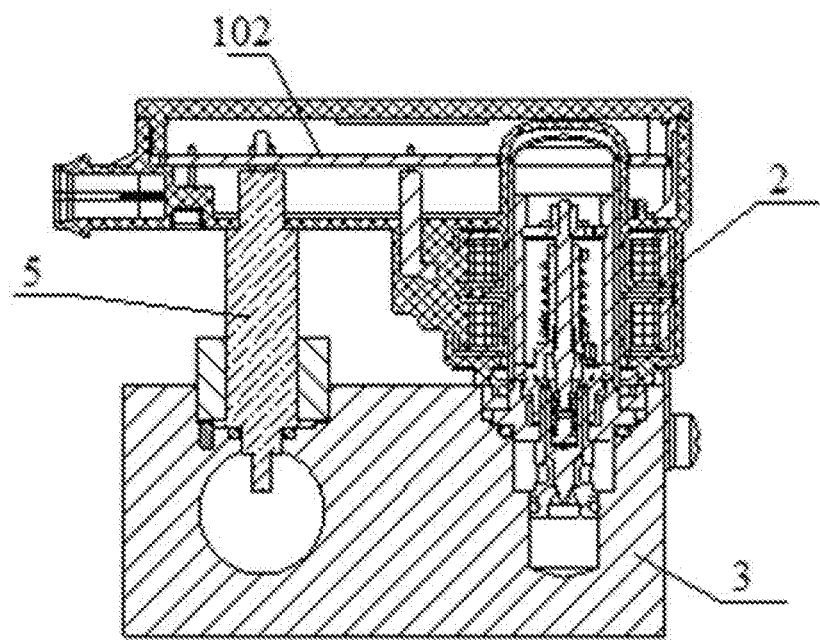
FIG. 16 is a schematic cross-sectional view showing the structure of the fourth embodiment of the electronic expansion valve.

FIGS. 15 and 16 show a fourth embodiment of the electronic expansion valve. The main differences between the present embodiment and the first embodiment are as follows: the length of the sensor 5 is increased, and the electronic control board 102 covers at least part of an upper portion of the stator assembly 2, so that the area of the electronic control board 102 is increased, which facilitate the arrangement of the connection points of the sensor 5 and allows the stator assembly 2 to extend radially. The size of the electronic expansion valve is reduced, while ensuring a large area of the electronic control board 102. Other methods of connecting the sensor with the valve body and the electrical control portion can be the same as the methods of the first embodiment, the second embodiment, and the third embodiment.

The manufacturing method of the electronic expansion valve of the fourth embodiment is the same as the manufacturing method of the electronic expansion valve of one of the first embodiment, the second embodiment and the third embodiment.

It should be noted that, the above embodiments are only used to illustrate the present application and not intended to limit the technical solutions of the present application. Although the present application is described in detail with reference to the above embodiments, it should be understood by those skilled in the art that, various modifications and equivalents can be made to the technical solutions of the present application without departing from the spirit and

What we claim is:

1. An electronic expansion valve, comprising a valve core assembly,
an electronic control portion and a stator assembly,
wherein the valve core assembly comprises a valve port, a valve core and a rotor assembly, the valve port is arranged in a valve seat, and the valve core is movable relative to the valve seat to change an opening of the valve port;
the electronic control portion is configured to control the stator assembly, and the rotor assembly is configured to drive the valve core to move; and
the electronic expansion valve further comprises a sensor comprising a sensor body, a sensing head and a pin, the sensor body comprises a main body portion, the sensor is a temperature sensor or a pressure sensor or a temperature and pressure sensor, the electronic control portion comprises an electronic control board, and the stator assembly and the sensor are electrically connected with the electronic control board,
wherein the electronic control portion further comprises a cover body, the cover body is provided with an inner cavity, the electric control board is arranged in the inner cavity;
the cover body comprises an upper housing and a lower housing, and the upper housing and the lower housing are separately formed and are fixedly connected with each other; and
the lower housing is provided with a through hole, and the pin is capable of passing through the through hole,
wherein the electronic expansion valve further comprises a valve body, and the valve body comprises a first inlet, a first outlet, a second inlet and a second outlet; a first channel is formed between the first inlet and the first outlet, and a second channel is formed between the second inlet and the second outlet;
at least part of a valve seat is arranged in the first channel or a first chamber in communication with the first channel, and a sensing head is located in the second channel or a second chamber in communication with the second channel; and
the sensor is directly welded to and fixedly connected to the valve body in a sealing manner, or the sensor is fixedly connected to the valve body through a first position-limiting portion, and the first position-limiting portion at least limits rotation of the sensor relative to the valve body,
wherein the first position-limiting portion comprises an intercommunicating hole and an external-thread segment, the main body portion of the sensor is capable of passing through the intercommunicating hole, and the valve body comprises an internal-thread segment at a position corresponding to the second chamber;
the sensor body further comprises a flange portion, the flange portion is arranged between the main body portion and the pin, an outer diameter of the flange portion is larger than the outer diameter of the main body portion, the flange portion is incapable of passing through the intercommunicating hole, a lower end surface of the flange portion is in contact with the valve body, and the first position-limiting portion is arranged around a periphery of the main body portion and is limited by the flange portion; and
the external-thread segment is in threaded connection with the internal-thread segment,
wherein a sealing ring is arranged between the sensor and the valve body;
the sensor body further comprises a connecting portion, and the connecting portion is arranged between the flange portion and the sensing head; and
a diameter of the connecting portion is smaller than the diameter of the main body portion, a stepped portion is formed by the connecting portion and the lower end surface of the flange portion, and the sealing ring is arranged between the valve body and the lower end surface of the flange portion.

2. The electronic expansion valve according to claim 1, wherein the sensing head and the pin are respectively arranged at two ends of the sensor body, and the pin is electrically connected with the electronic control board directly.

3. The electronic expansion valve according to claim 1, wherein
the sensor body comprises a guiding portion, a diameter of the guiding portion is smaller than a diameter of the main body portion, and a stepped surface is formed between the guiding portion and the main body portion;
the guiding portion is connected with the pin, and the guiding portion is located between the main body portion and the pin, and both the guiding portion and the pin enter the inner cavity of the cover body through the through hole; and
the stepped surface limits a distance at which the sensor extends into the inner cavity of the cover body, and the main body portion is welded to the lower housing in a sealing manner.

4. The electronic expansion valve according to claim 1, wherein the electronic expansion valve further comprises a position-limiting pin, the valve body is provided with a first mounting portion, the flange portion is provided with a second mounting portion, the position-limiting pin is arranged between the first mounting portion and the second mounting portion, and the position-limiting pin defines a mounting position of the sensor relative to the valve body.

5. The electronic expansion valve according to claim 1, wherein
the first position-limiting portion comprises a circlip and a position-limiting pin, the valve body is provided with an annular groove, the sensor body comprises the flange portion, and the circlip is embedded in the annular groove;
the circlip limits an upward movement of the flange portion relative to the valve body, and the lower end surface of the flange portion is in contact with the valve body; and
the valve body comprises a first mounting portion, the flange portion comprises a second mounting portion, and the position-limiting pin is arranged between the first mounting portion and the second mounting portion.

6. The electronic expansion valve according to claim 5, wherein
a sealing ring is arranged between the sensor and the valve body, the sensor body further comprises a connecting portion, and the connecting portion is arranged between the main body portion and the sensing head; and
the diameter of the connecting portion is smaller than the diameter of the main body portion, the connecting portion is provided with an annular groove, and the sealing ring is arranged in the annular groove.

7. The electronic expansion valve according to claim 1, wherein the lower housing is fixed to the stator assembly by injection molding, the electronic control portion and the stator assembly are arranged side by side on a same side of the valve body, the electronic control board is perpendicular to the sensor, and the sensor is parallel to a central axis of the valve core.

8. The electronic expansion valve according to claim 1, wherein the lower housing is fixed to the stator assembly by injection molding, the electronic control portion is arranged in parallel with the stator assembly on a same side of the valve body, the electronic control board is perpendicular to the sensor, and the sensor is parallel to a central axis of the valve core.

9. A thermal management assembly, comprising an electronic expansion valve and a heat exchanger, wherein
the electronic expansion valve and the heat exchanger are connected with each other to form an integrated unit; the electronic expansion valve comprises a valve core assembly, an electronic control portion and a stator assembly,
wherein the valve core assembly comprises a valve port, a valve core and a rotor assembly, the valve port is arranged in a valve seat, and the valve core is movable relative to the valve seat to change an opening of the valve port;
the electronic control portion is configured to control the stator assembly, and the rotor assembly is configured to drive the valve core to move; and
the electronic expansion valve further comprises a sensor comprising a sensor body, a sensing head and a pin, the sensor body comprises a main body portion, the sensor is a temperature sensor or a pressure sensor or a temperature and pressure sensor, the electronic control portion comprises an electronic control board, and the stator assembly and the sensor are electrically connected with the electronic control board,
wherein the electronic control portion further comprises a cover body, the cover body is provided with an inner cavity, the electric control board is arranged in the inner cavity;
the cover body comprises an upper housing and a lower housing, and the upper housing and the lower housing are separately formed and are fixedly connected with each other; and
the lower housing is provided with a through hole, and the pin is capable of passing through the through hole,
wherein the electronic expansion valve further comprises a valve body, and the valve body comprises a first inlet, a first outlet, a second inlet and a second outlet; a first channel is formed between the first inlet and the first outlet, and a second channel is formed between the second inlet and the second outlet;
at least part of the valve seat is arranged in the first channel or a first chamber in communication with the first channel, and the sensing head is located in the second channel or a second chamber in communication with the second channel; and
the sensor is directly welded to and fixedly connected to the valve body in a sealing manner, or the sensor is fixedly connected to the valve body through a first position-limiting portion, and the first position-limiting portion at least limits rotation of the sensor relative to the valve body,
wherein the first position-limiting portion comprises an intercommunicating hole and an external-thread segment, the main body portion of the sensor is capable of passing through the intercommunicating hole, and the valve body comprises an internal-thread segment at a position corresponding to the second chamber;
the sensor body further comprises a flange portion, the flange portion is arranged between the main body portion and the pin, an outer diameter of the flange portion is larger than the outer diameter of the main body portion, the flange portion is incapable of passing through the intercommunicating hole, a lower end surface of the flange portion is in contact with the valve body, and the first position-limiting portion is arranged around a periphery of the main body portion and is limited by the flange portion; and
the external-thread segment is in threaded connection with the internal-thread segment,
wherein a sealing ring is arranged between the sensor and the valve body;
the sensor body further comprises a connecting portion, and the connecting portion is arranged between the flange portion and the sensing head; and
a diameter of the connecting portion is smaller than the diameter of the main body portion, a stepped portion is formed by the connecting portion and the lower end surface of the flange portion, and the sealing ring is arranged between the valve body and the lower end surface of the flange portion.

10. A method for manufacturing an electronic expansion valve, wherein the electronic expansion valve comprises a valve core assembly, an electronic control portion and a stator assembly,
wherein the valve core assembly comprises a valve port, a valve core and a rotor assembly, the valve port is arranged in a valve seat, and the valve core is movable relative to the valve seat to change an opening of the valve port;
the electronic control portion is configured to control the stator assembly, and the rotor assembly is configured to drive the valve core to move; and
the electronic expansion valve further comprises a sensor comprising a sensor body, a sensing head and a pin, the sensor body comprises a main body portion, the sensor is a temperature sensor or a pressure sensor or a temperature and pressure sensor, the electronic control portion comprises an electronic control board, and the stator assembly and the sensor are electrically connected with the electronic control board,
wherein the electronic control portion further comprises a cover body, the cover body is provided with an inner cavity, the electric control board is arranged in the inner cavity;
the cover body comprises an upper housing and a lower housing, and the upper housing and the lower housing are separately formed and are fixedly connected with each other; and
the lower housing is provided with a through hole, and the pin is capable of passing through the through hole,
wherein the electronic expansion valve further comprises a valve body, and the valve body comprises a first inlet, a first outlet, a second inlet and a second outlet a first channel is formed between the first inlet and the first outlet, and a second channel is formed between the second inlet and the second outlet;
at least part of the valve seat is arranged in the first channel or a first chamber in communication with the first channel, and the sensing head is located in the second channel or a second chamber in communication with the second channel; and the sensor is directly welded to and fixedly connected to the valve body in a sealing manner, or the sensor is fixedly connected to the valve body through a first position-limiting portion, and the first position-limiting portion at least limits rotation of the sensor relative to the valve body, wherein the first position-limiting portion comprises an intercommunicating hole and an external-thread segment, the main body portion of the sensor is capable of passing through the intercommunicating hole, and the valve body comprises an internal-thread segment at a position corresponding to the second chamber;

the sensor body further comprises a flange portion, the flange portion is arranged between the main body portion and the pin, an outer diameter of the flange portion is larger than the outer diameter of the main body portion, the flange portion is incapable of passing through the intercommunicating hole, a lower end surface of the flange portion is in contact with the valve body, and the first position-limiting portion is arranged around a periphery of the main body portion and is limited by the flange portion; and the external-thread segment is in threaded connection with the internal-thread segment, wherein a sealing ring is arranged between the sensor and the valve body;

the sensor body further comprises a connecting portion, and the connecting portion is arranged between the flange portion and the sensing head; and a diameter of the connecting portion is smaller than the diameter of the main body portion, a stepped portion is formed by the connecting portion and the lower end surface of the flange portion, and the sealing ring is arranged between the valve body and the lower end surface of the flange portion; the method comprises:

a1, mounting the valve core assembly to the valve body;

a2, fixing the sensor to the valve body;

a3, fixing the stator assembly to the valve body;

a4, installing the electronic control board, and electrically connecting the electronic control board with the stator assembly and the sensor; and a5, sealing the cover body configured to accommodate the electronic control board.

11. A cooling system comprising a compressor, an evaporator, a condenser and an electronic expansion valve, wherein the electronic expansion valve is arranged between the condenser and the evaporator, the first electronic expansion valve comprises a valve core assembly, an electronic control portion and a stator assembly, wherein the valve core assembly comprises a valve port, a valve core and a rotor assembly, the valve port is arranged in a valve seat, and the valve core is movable relative to the valve seat to change an opening of the valve port;

the electronic control portion is configured to control the stator assembly, and the rotor assembly is configured to drive the valve core to move; and the electronic expansion valve further comprises a sensor comprising a sensor body, a sensing head and a pin, the sensor body comprises a main body portion, the sensor is a temperature sensor or a pressure sensor or a temperature and pressure sensor, the electronic control portion comprises an electronic control board, and the stator assembly and the sensor are electrically connected with the electronic control board, wherein the electronic control portion further comprises a cover body, the cover body is provided with an inner cavity, the electric control board is arranged in the inner cavity;

the cover body comprises an upper housing and a lower housing, and the upper housing and the lower housing are separately formed and are fixedly connected with each other; and the lower housing is provided with a through hole, and the pin is capable of passing through the through hole, wherein the electronic expansion valve further comprises a valve body, and the valve body comprises a first inlet, a first outlet, a second inlet and a second outlet; a first channel is formed between the first inlet and the first outlet, and a second channel is formed between the second inlet and the second outlet;

at least part of the valve seat is arranged in the first channel or a first chamber in communication with the first channel, and the sensing head is located in the second channel or a second chamber in communication with the second channel; and the sensor is directly welded to and fixedly connected to the valve body in a sealing manner, or the sensor is fixedly connected to the valve body through a first position-limiting portion, and the first position-limiting portion at least limits rotation of the sensor relative to the valve body, wherein the first position-limiting portion comprises an intercommunicating hole and an external-thread segment, the main body portion of the sensor is capable of passing through the intercommunicating hole, and the valve body comprises an internal-thread segment at a position corresponding to the second chamber;

the sensor body further comprises a flange portion, the flange portion is arranged between the main body portion and the pin, an outer diameter of the flange portion is larger than the outer diameter of the main body portion, the flange portion is incapable of passing through the intercommunicating hole, a lower end surface of the flange portion is in contact with the valve body, and the first position-limiting portion is arranged around a periphery of the main body portion and is limited by the flange portion; and the external-thread segment is in threaded connection with the internal-thread segment, wherein a sealing ring is arranged between the sensor and the valve body;

the sensor body further comprises a connecting portion, and the connecting portion is arranged between the flange portion and the sensing head; and a diameter of the connecting portion is smaller than the diameter of the main body portion, a stepped portion is formed by the connecting portion and the lower end surface of the flange portion, and the sealing ring is arranged between the valve body and the lower end surface of the flange portion.

* * * * *